United States Patent
Crivelli et al.

(12) 
(10) Patent No.: US 6,319,780 B2
(45) Date of Patent: Nov. 20, 2001

(54) PROCESS FOR THE FABRICATION OF AN INTEGRATED CIRCUIT COMPRISING MOS TRANSISTORS FOR LOW VOLTAGE, EPROM CELLS AND MOS TRANSISTORS FOR HIGH VOLTAGE

(75) Inventors: Barbara Crivelli; Daniela Peschiaroli; Elisabetta Palumbo, all of Milan; Nicola Zatelli, Bergamo, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/727,266

(22) Filed: Nov. 29, 2000

(30) Foreign Application Priority Data

Nov. 29, 1999 (EP) .................................................. 99830742

(51) Int. Cl.⁷ ............................................. H01L 21/8234
(52) U.S. Cl. ........................ 438/275; 438/201; 438/258; 438/981
(58) Field of Search ................................... 438/201, 211, 438/258, 275, 981

(56) References Cited

U.S. PATENT DOCUMENTS

| | | | |
|---|---|---|---|
| 4,651,406 | * 3/1987 | Shimizu et al. | 438/275 |
| 5,723,355 | 3/1998 | Chang et al. | 437/56 |
| 6,159,799 | * 12/2000 | Yu | 438/258 |

FOREIGN PATENT DOCUMENTS

| | | | |
|---|---|---|---|
| 0542575 | * 5/1993 | (EP) . | |
| 0811983 | 12/1997 | (EP) | G11C/11/34 |
| 0751559 | 1/1997 | (EP) | H01L/21/8247 |
| 0751560 | 1/1997 | (EP) | H01L/21/8247 |

OTHER PUBLICATIONS

Patent Abstracts of Japan vol. 018, No. 266 (E–1551), May 20, 1994, & JP 06 045 614 A (Nec Corp), Feb. 18, 1994.

Patent Abstracts of Japan vol. 1995, No. 10, Nov. 30, 1995 & JP 07 183409 A (Seiko Epson Corp), Jul. 21, 1995.

* cited by examiner

*Primary Examiner*—Chandra Chaudhari
(74) *Attorney, Agent, or Firm*—Lisa K. Jorgenson; Allen, Dyer, Doppelt, Milbrath & Gilchrist, P.A.

(57) ABSTRACT

Active areas and body regions are formed in a substrate for forming low voltage MOS transistors, high voltage MOS transistors, and EPROM cells. A thermal oxide layer is formed on the substrate, and a first polycrystalline silicon layer is formed on the thermal oxide layer. The polycrystalline silicon layer is selectively removed to form the floating gate electrodes of the EPROM cells, and the source and drain regions of the EPROM cells are also formed. The active areas for the high voltage MOS transistors are exposed, and a layer of high temperature oxide is formed and nitrided. The active area for the low voltage MOS transistors are exposed, and a layer of thermal oxide is formed on the exposed areas. A second polycrystalline silicon layer is deposited, which is then selectively removed to form the gate electrodes of the low voltage and high voltage MOS transistors, and the control gate electrodes of the EPROM cells.

25 Claims, 2 Drawing Sheets

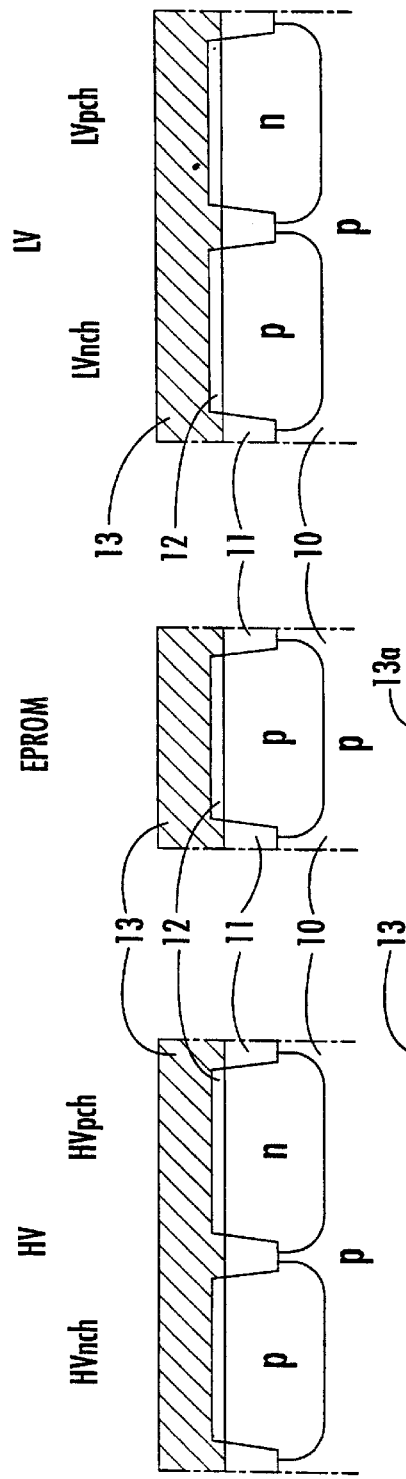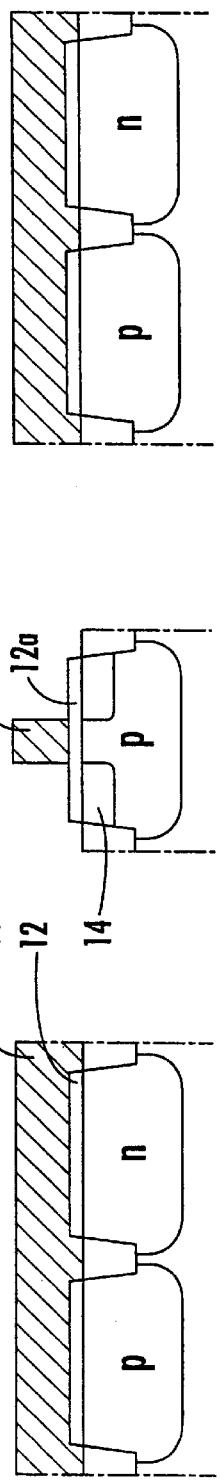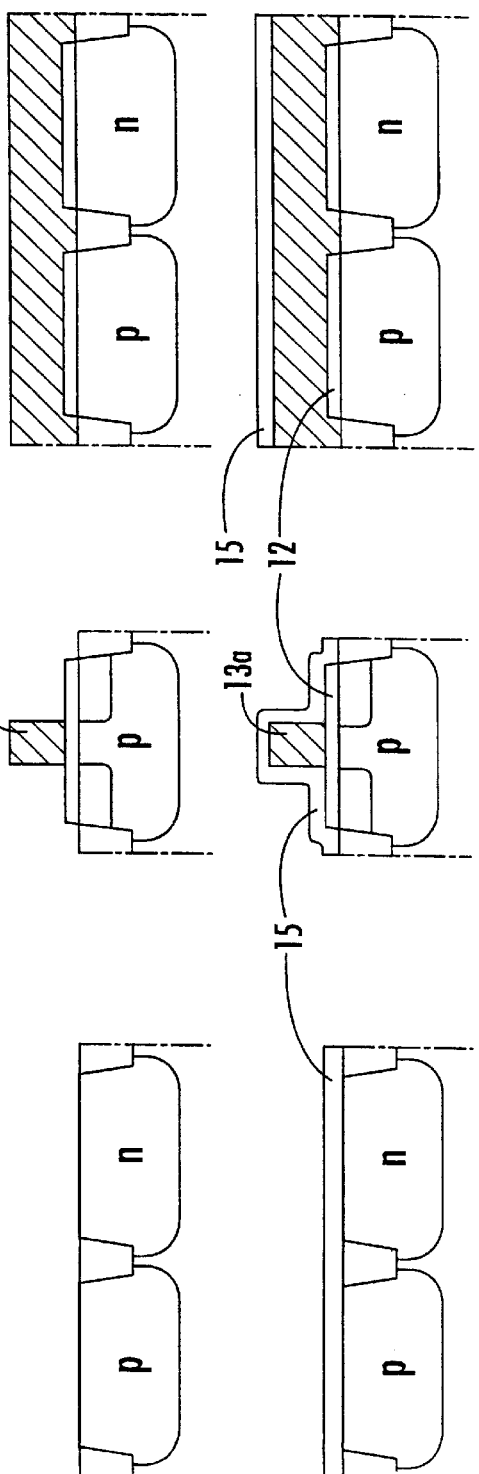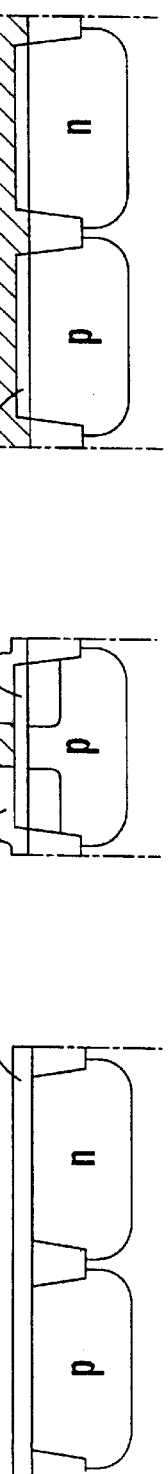

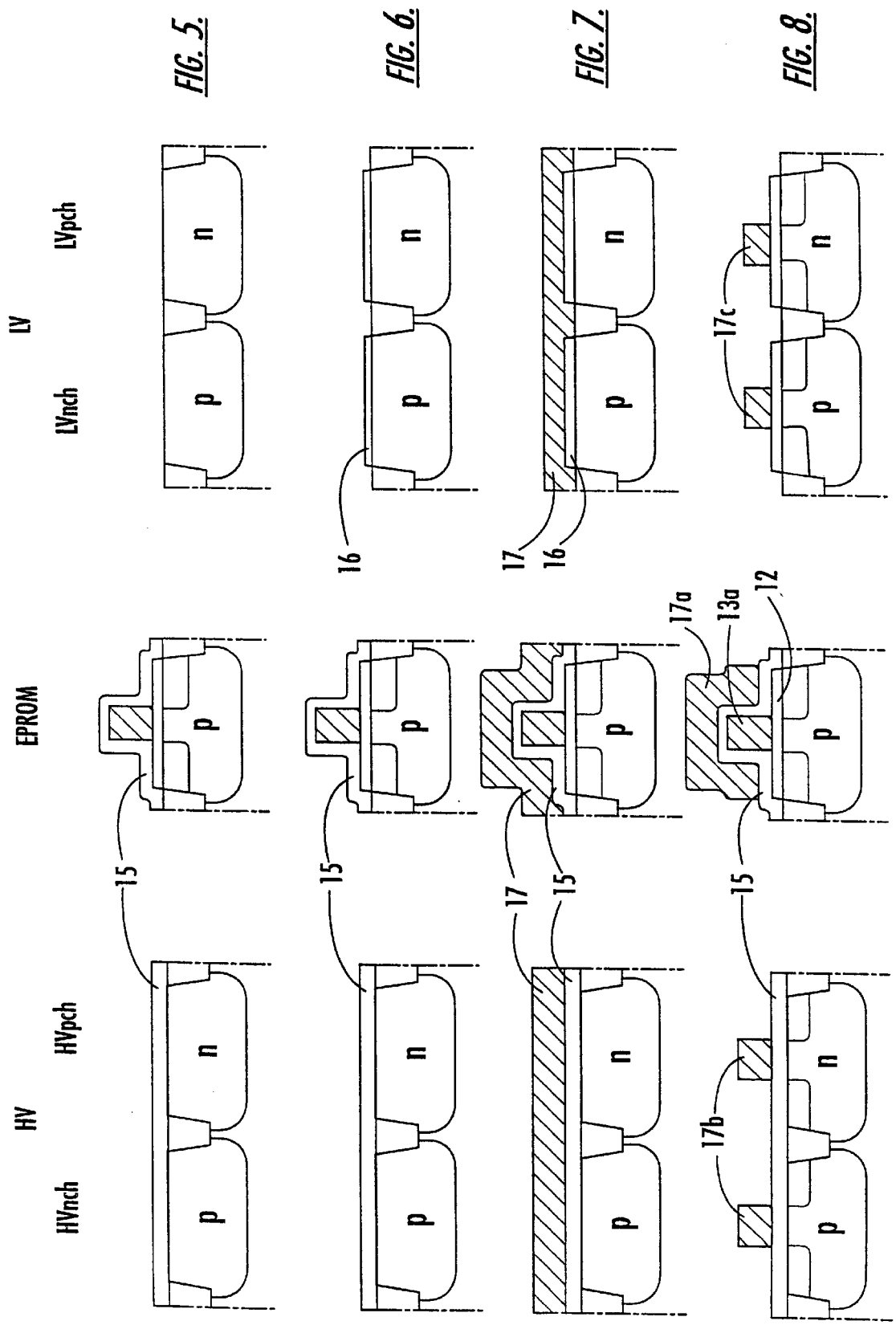

PROCESS FOR THE FABRICATION OF AN INTEGRATED CIRCUIT COMPRISING MOS TRANSISTORS FOR LOW VOLTAGE, EPROM CELLS AND MOS TRANSISTORS FOR HIGH VOLTAGE

FIELD OF THE INVENTION

The present invention relates to the fabrication of integrated circuits and, more particularly, to a process for forming an integrated circuit comprising low voltage MOS transistors, EPROM cells, and high voltage MOS transistors. The low voltage MOS transistors include gate electrodes separated from a substrate by a first dielectric material. The high voltage MOS transistors include gate electrodes separated from the substrate by a second dielectric material. The EPROM cells include floating gate electrodes separated from the substrate by a third dielectric material, and includes corresponding control electrodes separated from the floating gate electrodes by the second dielectric material.

BACKGROUND OF THE INVENTION

In the design of integrated circuit devices intended for the processing of digital signals, such as microprocessors, for example, it is sometimes necessary to include an electrically programmable non-volatile memory cell and corresponding decoding circuits in the same integrated circuit. These electrically programmable non-volatile memory cells are known as electrically programmable read only memories EPROMS.

This requirement gives rise to considerable problems in manufacture, and primarily because of the following reason. The processing circuits, or logic circuits for short, are made using low voltage technology. Low voltage technology uses processes for forming devices, particularly MOS transistors, capable of withstanding relative low voltages within a range of 1 to 3 V. Low voltage throughout the application will be indicated by the symbol LV.

In contrast, the decoding circuits of the memories require devices, essentially MOS transistors, capable of operating at relatively high voltages within a range of 7 to 10 V. High voltage throughout the application will be indicated by the symbol HV. This means that the gate dielectrics of the HV devices must have physical characteristics and/or thicknesses which are different from those used in the LV devices. Therefore, the HV devices require special operations for their formation and definition.

In addition, the gate dielectrics of EPROM cells require a thickness which is different from that of the gate dielectrics of the LV devices and the HV devices. The gate dielectrics of EPROM cells also requires specific characteristics to ensure the permanence of the stored data over time.

A prior art process for forming the different types of devices in a single integrated circuit includes the combination of the three specific processes for forming the three types of devices. In other words, this process requires a number of masking operations close to the sum of the masking operations of the three specific processes. However, a process of this kind has a high cost due to both the large number of operations required, and the resulting low yield. The production yield decreases with an increase in a number of operations in the process.

Producing HV circuits together with LV circuits without making use of specific processes for HV devices can be accomplished using a known circuit arrangement in which two or more LV devices, connected in a cascode configuration, are used. However, this approach can be applied advantageously only when the number of HV devices is small. Otherwise, because each HV device is formed from at least two LV devices, the supplementary area required becomes unacceptably large. Moreover, this does not help with the formation of the memory cells. All the specific operations for producing memory cells have to be added to the process in any case.

SUMMARY OF THE INVENTION

An object of the present invention is to provide a process for forming low voltage circuits, high voltage circuits and EPROM memory cells of the one time programmable OTP type within a single integrated circuit by using a small number of operations in addition to those normally used for forming low voltage circuits. This achieves a production yield very close to that which can be achieved with a process designed for forming logic circuits with transistors of the low voltage type.

A process is provided for forming an integrated circuit comprising at least one low voltage MOS transistor, at least one high voltage MOS transistor, and at least one EPROM cell. The process comprises defining on a silicon substrate at least one low voltage MOS transistor area, at least one high voltage MOS transistor area, and at least one EPROM cell area. Body regions are then preferably formed for the at least one low voltage MOS transistor area, for the at least one high voltage MOS transistor area, and for the at least one EPROM cell area.

The process preferably further includes forming a first dielectric layer on the silicon substrate, forming a first conducting layer on the first dielectric layer, removing the first conducting layer from the at least one EPROM cell area for forming a floating gate, and forming source and drain regions in the body region for the at least one EPROM cell area. The first conducting layer and the first dielectric layer are preferably removed from the at least one high voltage MOS transistor area.

The process preferably further includes forming a second dielectric layer on the silicon substrate for the at least one high voltage MOS transistor area, on the floating gate and the first dielectric layer for the at least one EPROM cell area, and on the first conducting layer for the at least one low voltage MOS transistor area. The second dielectric layer, the first conducting layer and the first dielectric layer are preferably removed from the at least one low voltage MOS transistor area.

A third dielectric layer is preferably formed on the silicon substrate for the at least one low voltage MOS transistor area, and a second conducting layer is formed on the third dielectric layer, and on the second dielectric layer for the at least one EPROM cell area and the at least one high voltage MOS transistor area. The second conducting layer is preferbly selectively removed to form a gate for the at least one low voltage MOS transistor, to form a gate for the at least one high voltage MOS transistor, and to form a control gate for the at least one EPROM cell. Source and drain regions are then preferably formed in the body region for the low voltage MOS transistor area for the at least one low voltage MOS transistor, and in the body region for the high voltage MOS transistor area for the at least one high voltage MOS transistor.

BRIEF DESCRIPTION OF THE DRAWINGS

The invention will be more clearly understood from the following detailed description of an embodiment provided by way of an example and, therefore, without restrictive intent, with reference to the attached drawings.

FIGS. 1 to 8 show a cross section of three portions of an integrated circuit formed on a wafer of monocrystalline silicon using successive steps of the process according to the present invention.

DETAILED DESCRIPTION OF THE PREFERRED EMBODIMENTS

Referring now to FIGS. 1 to 8, the three illustrated portions relate to a pair of low voltage MOS transistors indicated by LV, a pair of high voltage MOS transistors indicated by HV, and a memory cell of a matrix of EPROM cells indicated by EPROM. The pair of low voltage MOS transistors includes an n-channel type and a p-channel type indicated by LVnch and LVpch, respectively. The pair of high voltage MOS transistors includes an n-channel type and a p-channel type indicated by HVnch and HVpch, respectively.

FIG. 1 shows the structures of the three portions after a series of well known operations of an integrated circuit fabrication process. Briefly, these operations comprise, initially, the definition on a substrate 10 of monocrystalline silicon of p-type areas. These p-type areas are known as active areas, and are insulated from each other by silicon dioxide inserts 11, known as the field oxide.

A next step is the doping of the active areas to form p-type and n-type regions designed to form the body regions of the LV and HV MOS transistors and of the EPROM cells. This is followed by the formation of a relatively thin (5–10 nm) layer 12 of silicon dioxide by thermal oxidation of the silicon of the substrate, and the formation of a layer 13 of polycrystalline silicon doped with n-type impurities on the oxide layer 12.

The polycrystalline silicon is then removed selectively by the use of known photolithographic techniques to form the floating gate electrodes of the EPROM cells. Only one of these electrodes, indicated by 13a, is shown in FIG. 2. The portion 12a of the thin oxide layer 12 which is located under the gate electrode 13a forms the gate dielectric of the EPROM cell. Doping impurities are then implanted in the p-type body regions of the cells to form n-type source and drain regions indicated by 14 in FIG. 2.

The superimposed layers of polycrystalline silicon 13 and thin oxide 12 are removed by suitable chemical etching from the areas to be used for the HV transistors. The etching continues until the silicon of the substrate 10 is exposed, as shown in FIG. 3.

A layer 15 of silicon dioxide (FIG. 4) is then formed over the entire wafer by a deposition treatment carried out at a relatively high temperature (700–800° C.). This treatment is known by the abbreviation HTO (High Temperature Oxidation). This layer has a thickness within the range of 10 to 20 nm. This is followed by an annealing treatment in an atmosphere containing nitrogen, for example, $N_2O$ at 900° C. The silicon dioxide of the layer 15 is thus "nitrided."

In other words, the silicon dioxide is permeated by nitrogen atoms which, without changing their chemical structure, impart to the resulting material characteristics which make it suitable for use either as a gate dielectric for HV transistors or as an intermediate dielectric for EPROM cells. This makes it impermeable to oxygen atoms, thus permitting a further stage of thermal oxidation on other areas of the substrate.

The other areas are those to be used for the LV transistors, which, in order to be subjected to thermal oxidation, are subjected (FIG. 5) to a suitable etching process to remove all the layers formed on them by the preceding operations. The parameters in this stage of processing are selected in such a way to form a layer 16 of silicon dioxide having the thickness required for the gate dielectric of the LV transistors (for example, 5 nm).

A second layer of non-doped polycrystalline silicon, indicated by 17 (FIG. 7), is then deposited over the entire wafer. The polycrystalline silicon of this layer is then removed selectively by known photolithographic techniques to form the control gate electrodes 17a (FIG. 8) of the EPROM cells, the gate electrodes 17b of the HV transistors and the gate electrodes 17c of the LV transistors.

The source and drain regions of the transistors are formed in the body regions of the HV and LV transistors in the usual way. That is, by suitable masking and implantation of doping impurities of the n-type for the n-channel transistors and of the p-type for the p-channel transistors.

The process continues with the usual operations for forming the integrated circuit. These processes include forming metal connections between the components of the integrated circuit, coating with a layer of protective dielectric, and forming terminal contact electrodes of the integrated circuit. The wafer is then cut into chips, and the individual chips are mounted in suitable structures for connection to an external circuit.

Using the process according to the invention, it is possible to produce EPROM memory cells suitable for being programmed at least once in a secure way and with excellent stability. The EPROM memory cells also retain the desirable characteristics of the dielectric material (HTO) used for the intermediate dielectric. This is at the same time as high-quality HV transistors are formed by using only three masks in addition to those necessary for an ordinary process of fabricating integrated logic circuits containing only LV transistors.

The total number of masks is much smaller than it is for a process based upon a combination of the known specific processes for forming LV transistors, EPROM cells and HV transistors. The process according to the invention is very convenient in terms of production costs because the total treatment time is short, and the production yield is relatively high.

It should also be noted that the supplementary operations do not interfere with the ordinary operations for forming the characteristic elements of the LV transistors (thermal oxide for the gate dielectric, implantation of body, source and drain), and therefore, the logic circuits obtainable by the process according to the invention do not differ from those obtainable by an ordinary process designed to produce only this type of circuit.

That which is claimed is:

1. A process for forming an integrated circuit comprising at least one low voltage MOS transistor, at least one high voltage MOS transistor, and at least one EPROM cell, the process comprising:
    a) defining on a silicon substrate at least one low voltage MOS transistor area, at least one high voltage MOS transistor area, and at least one EPROM cell area;
    b) forming a body region for the at least one low voltage MOS transistor area, a body region for at least one high voltage MOS transistor area, and a body region for the at least one EPROM cell area;
    c) forming a first dielectric layer on the silicon substrate;
    d) forming a first conducting layer on the first dielectric layer;

e) removing the first conducting layer from the at least one EPROM cell area for forming a floating gate;

f) forming source and drain regions in the body region for the at least one EPROM cell area;

g) removing the first conducting layer and the first dielectric layer from the at least one high voltage MOS transistor area;

h) forming a second dielectric layer on the silicon substrate for the at least one high voltage MOS transistor area, on the floating gate and the first dielectric layer for the at least one EPROM cell area, and on the first conducting layer for the at least one low voltage MOS transistor area;

i) removing the second dielectric layer, the first conducting layer and the first dielectric layer from the at least one low voltage MOS transistor area;

j) forming a third dielectric layer on the silicon substrate for the at least one low voltage MOS transistor area;

k) forming a second conducting layer on the third dielectric layer, and on the second dielectric layer for the at least one EPROM cell area and the at least one high voltage MOS transistor area;

l) selectively removing the second conducting layer to form a gate for the at least one low voltage MOS transistor, to form a gate for the at least one high voltage MOS transistor, and to form a control gate for the at least one EPROM cell; and m) forming source and drain regions in the body region for the low voltage MOS transistor area for the at least one low voltage MOS transistor, and in the body region for the high voltage MOS transistor area for the at least one high voltage MOS transistor.

2. A process according to claim 1, wherein the first and second conducting layers each comprises polycrystalline silicon.

3. A process according to claim 1, wherein the second dielectric layer comprises silicon dioxide, and the method further comprises annealing the silicon dioxide in an atmosphere containing nitrogen to nitride the silicon dioxide.

4. A process according to claim 1, wherein the third dielectric layer is formed by thermal oxidation of the silicon substrate.

5. A process according to claim 1, wherein the first dielectric layer is formed by thermal oxidation of the silicon substrate.

6. A process according to claim 1, wherein forming source and drain regions for the at least one EPROM cell comprises implanting dopant impurities through a mask into the at least one EPROM cell area while also using the first conducting layer over the low voltage and high voltage MOS transistor areas as a mask.

7. A process for forming an integrated circuit comprising at least one low voltage transistor, at least one high voltage transistor, and at least one memory cell, the process comprising:

a) forming a body region in at least one low voltage transistor area in a substrate, a body region in at least one high voltage transistor area in the substrate, and a body region in at least one memory cell area in the substrate;

b) forming a first dielectric layer on the substrate;

c) forming a first conducting layer on the first dielectric layer;

d) removing the first conducting layer from the at least one memory cell area for forming a gate;

e) forming source and drain regions in the body region for the at least one memory cell area;

f) removing the first conducting layer and the first dielectric layer from the at least one high voltage transistor area;

g) forming a second dielectric layer on the substrate for the at least one high voltage transistor area, on the gate and the first dielectric layer for the at least one memory cell area, and on the first conducting layer for the at least one low voltage transistor area;

h) removing the second dielectric layer, the first conducting layer and the first dielectric layer from the at least one low voltage transistor area;

i) forming a third dielectric layer on the substrate for the at least one low voltage transistor area;

j) forming a second conducting layer on the third dielectric layer, and on the second dielectric layer for the at least one memory cell area and the at least one high voltage transistor area; and k) selectively removing the second conducting layer to form a gate for the at least one low voltage transistor, to form a gate for the at least one high voltage transistor, and to form a control gate for the at least one memory cell.

8. A process according to claim 7, further comprising forming source and drain regions in the body region for the low voltage transistor area for the at least one low voltage transistor, and in the body region for the high voltage transistor area for the at least one high voltage transistor.

9. A process according to claim 7, wherein the substrate comprises silicon.

10. A process according to claim 7, wherein the first and second conducting layers each comprises polycrystalline silicon.

11. A process according to claim 7, wherein the second dielectric layer comprises silicon dioxide, and the method further comprises annealing the silicon dioxide in an atmosphere containing nitrogen to nitride the silicon dioxide.

12. A process according to claim 7, wherein the third dielectric layer is formed by thermal oxidation of the substrate.

13. A process according to claim 7, wherein the first dielectric layer is formed by thermal oxidation of the substrate.

14. A process according to claim 7, wherein forming source and drain regions for the at least one memory cell comprises implanting dopant impurities through a mask into the at least one memory cell area while also using the first conducting layer over the low voltage and high voltage transistor areas as a mask.

15. A process according to claim 7, wherein the at last one low voltage transistor comprises a MOS transistor, the at last one high voltage transistor comprises a MOS transistor, and the at last one memory cell comprises an EPROM cell.

16. A process for forming an integrated circuit comprising at least one low voltage transistor, at least one high voltage transistor, and at least one memory cell, the process comprising:

a) forming a body region in at least one low voltage transistor area in a substrate, a body region in at least one high voltage transistor area in the substrate, and a body region in at least one memory cell area in the substrate;

b) forming a first dielectric layer on the substrate;

c) forming a first conducting layer on the first dielectric layer;

d) selectively removing the first conducting layer over the at least one memory cell area for forming a gate;

e) forming source and drain regions in the body region for the at least one memory cell area by implanting dopant impurities through a mask into the at least one memory cell area while also using the first conducting layer over the low voltage and high voltage transistor areas as a mask;

f) removing the first conducting layer and the first dielectric layer from the at least one high voltage transistor area;

g) forming a second dielectric layer on the substrate for the at least one high voltage transistor area, on the gate and the first dielectric layer for the at least one memory cell area, and on the first conducting layer for the at least one low voltage transistor area;

h) removing the second dielectric layer, the first conducting layer and the first dielectric layer from the at least one low voltage transistor area;

i) annealing the substrate;

j) forming a third dielectric layer on the substrate for the at least one low voltage transistor area; and k) forming a second conducting layer on the third dielectric layer, and on the second dielectric layer for the at least one memory cell area and the at least one high voltage transistor area.

17. A process according to claim 16, further comprising selectively removing the second conducting layer to form a gate for the at least one low voltage transistor, to form a gate for the at least one high voltage transistor, and a control gate for the at least one memory cell.

18. A process according to claim 17, further comprising forming source and drain regions in the body region for the low voltage transistor area for the at least one low voltage transistor, and in the body region for the high voltage transistor area for the at least one high voltage transistor.

19. A process according to claim 16, wherein the substrate comprises silicon.

20. A process according to claim 16, wherein the first and second conducting layers each comprises polycrystalline silicon.

21. A process according to claim 16, wherein the second dielectric layer comprises silicon dioxide, and wherein the silicon dioxide is annealed in an atmosphere containing nitrogen to nitride the silicon dioxide.

22. A process according to claim 16, wherein the third dielectric layer is formed by thermal oxidation of the substrate.

23. A process according to claim 16, wherein the first dielectric layer is formed by thermal oxidation of the substrate.

24. A process according to claim 16, wherein forming source and drain regions for the at least one memory cell comprises implanting dopant impurities through a mask into the at least one memory cell area while also using the first conducting layer over the low voltage and high voltage transistor areas as a mask.

25. A process according to claim 16, wherein the at last one low voltage transistor comprises a MOS transistor, the at last one high voltage transistor comprises a MOS transistor, and the at last one memory cell comprises an EPROM cell.

* * * * *